F462A    OR    4,469,977

United States Patent [19]

Quinn et al.

[11] Patent Number: 4,469,977

[45] Date of Patent: Sep. 4, 1984

[54] SUPERLATTICE ULTRASONIC WAVE GENERATOR

[75] Inventors: John J. Quinn, North Scituate, R.I.; Ulrich Strom, Hyattsville, Md.; Leroy L. Chang, Goldens Bridge, N.Y.

[73] Assignee: The United States of America as represented by the Secretary of the Navy, Washington, D.C.

[21] Appl. No.: 435,156

[22] Filed: Oct. 19, 1982

[51] Int. Cl.[3] .............................................. H01L 27/14

[52] U.S. Cl. ...................................... 310/334; 333/141; 357/4

[58] Field of Search ................ 148/175; 156/610, 612; 357/4, 16; 310/313 R, 337, 334, 333; 333/141, 147, 181

[56] References Cited

U.S. PATENT DOCUMENTS

| | | | |
|---|---|---|---|
| 2,716,708 | 8/1955 | Bradfield | 310/9.6 |
| 3,497,727 | 2/1970 | De Klerk et al. | 310/333 |
| 3,515,911 | 6/1970 | Byram et al. | 310/313 R |
| 3,543,058 | 11/1970 | Klemens | 333/141 |
| 3,626,257 | 12/1971 | Esaki et al. | 317/234 R |
| 3,626,328 | 12/1971 | Esaki | 331/107 G |
| 3,710,283 | 1/1973 | Alphonse | 333/141 |
| 3,929,527 | 12/1975 | Chang et al. | 148/175 |
| 4,205,329 | 5/1980 | Dingle et al. | 357/16 |
| 4,205,331 | 5/1980 | Esaki et al. | 357/30 |
| 4,348,686 | 9/1982 | Esaki et al. | 357/30 |

OTHER PUBLICATIONS

Physics Letters, vol. 25A, No. 7, dtd Oct. 9, 1967, entitled "Electromagnetic Generation of Acoustic Waves and the Surface Impedance of Metals", pp. 522-523, by J. J. Quinn.

*Primary Examiner*—J. D. Miller
*Assistant Examiner*—D. L. Rebsch
*Attorney, Agent, or Firm*—Robert F. Beers; William T. Ellis; Charles S. Guenzer

[57] ABSTRACT

An ultrasonic wave generator comprising a semiconductor superlattice with a periodic variation in its space charge and a far infrared laser for applying a transient electric field to the superlattice transverse to the direction of its periodic variation. The ultrasonic wave produced has a wavelength of the period of the superlattice which can result in 100 gigahertz ultrasonic waves. Structure is included for guiding these waves into an acoustic system.

13 Claims, 11 Drawing Figures

SUPERLATTICE ULTRASONIC WAVE GENERATOR

BACKGROUND OF THE INVENTION

The present invention relates generally to devices for generating very high frequency acoustic waves, and more particularly to a method of converting far infrared laser radiation into ultrasonic acoustic waves of the same frequency, in the range of 100 GHz to 1000 GHz.

DESCRIPTION OF THE PRIOR ART

At the present time there are many acoustic systems which are operating at frequencies of less than 1 GHz, such as surface acoustic wave devices used for signal processing. One class of these devices can be described as surface phonon optics because it involves the interaction of a surface acoustic wave and a light wave. The acoustic waves in such devices are usually generated by piezoelectric couplers in a periodic structure matched to the wavelength of the surface acoustic wave. Such couplers are described in U.S. Pat. Nos. 3,399,314 (Phillips) and 2,716,708 (Bradfield). However, these techniques require individual electrical contacts to be made to each of the electrodes of the periodic coupler. The separate electrode requirement coupled with limitations of the fabrication techniques in piezoelectric materials have imposed a 1 GHz limit on the acoustic waves produced.

High frequency acoustic waves are used in the acoustic microscope. However the limitation of 1 GHz imposed by present generators limits the resolution of present acoustic microscopes to no better than $10^{-4}$ cm. If a source of 100 GHz phonons were available, the resolution of the microscope would improve to $10^{-6}$ cm.

Another use of acoustic waves is for signal processing or for acousto-optical data systems. If the frequency of bulk acoustic waves could be raised from 1 GHZ to 100 or 1000 GHz, ultrahigh speed phonon systems could be developed which would operate at correspondingly higher data rates.

Acoustic waves of 100 to 1000 GHz are matched in frequency to far-infrared electromagnetic radiation although the acoustic wavelength is much larger. Far infrared light sources are readily available but transducers are presently unavailable which easily couple the electromagnetic wave energy into acoustic waves. Such transducers would facilitate the fabrication of the aforementioned acousto-optical data system.

Presently available sources of acoustic waves in the 100 to 1000 GHz range involve black-body phonon emission of heaters and superconducting tunnel-junctions. However black-body sources are broad band and do not provide the capability of a monochromatic phonon source. Furthermore they need to operate at 4.2K to yield 100 to 1000 GHz phonon generation. The superconducting tunnel junction does generate monochromatic waves but is inherently disadvantaged by the requirement of cryogenic temperatures.

OBJECTS OF THE INVENTION

Accordingly, it is an object of the present invention to provide for the generation of acoustic waves in the 100 to 1000 GHz and above frequency range.

It is a further object to provide a transducer from far infrared radiation to acoustic waves.

It is a yet a further object to provide an electrode-free acoustic generator.

It is still another object to provide an acoustic generator of monochromatic phonons.

It is a yet another object to provide a room temperature generator of acoustic waves.

SUMMARY OF THE INVENTION

Briefly, the present invention is a generator of ultrasonic acoustic waves. The core of the invention is a semiconductor superlattice of a type in which there is a net space charge which varies periodically with the superlattice. For example, a superlattice of InAs-GaSb of appropriate period has free excess carriers of opposite charge in the alternate layers. If a sinusoidally time varying electric field is applied in the plane of the layers, the electric field will transfer to the crystal momenta of opposite directions in the alternate layers. The sinusoidally varying momentum in the crystal will induce an acoustic wave of the same frequency as the electric field. The acoustic wave can be coupled into other structures and used therein.

The invention can also be used as a transducer between electric fields or between electromagnetic waves and acoustic waves.

In one embodiment, the alternating electric field may be provided by a far infrared laser. The alternating space-charge regions are also present in GaAs-GaAlAs superlattices and in modulation doped superlattices, i.e. a superlattice composed of the same semiconductor material but with dopants varying in density or of opposite signs in the alternate layers.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1A:
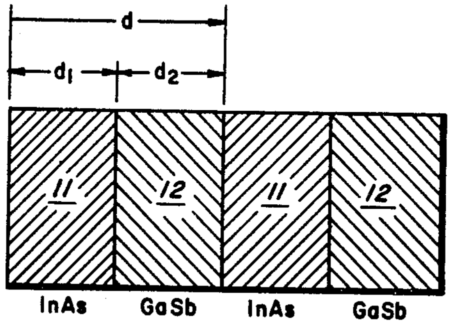
FIG. 1*a* is a cross-sectional representation of a superlattice of InAs-GaSb.

Referring now to the drawings, wherein like reference numerals designate identical or corresponding parts throughout the several views, a superlattice is shown in FIG. 1a. A superlattice is a material structure consisting of alternate layers of dissimilar materials. The thicknesses of the layers are much less than the lateral dimensions so only one dimension need by represented. FIG. 1a shows a superlattice of InAs-GaSb. The InSb layers 11 alternate with the GaSb layers 12. Only two complete periods are represented in FIG. 1a for ease of display but many more periods are required before the effects associated with the periodic variation dominate any edge effects. The InSb layers are all of essentially the thickness $d_1$; likewise the GaSb layers are of thickness $d_2$. The thickness $d_1$ and $d_2$ need not be equal but usually are made so in order to maximize periodic effects. The superlattice period d is the sum of $d_1$ and $d_2$ and is the distance between repeating structure.

Figure 1B:
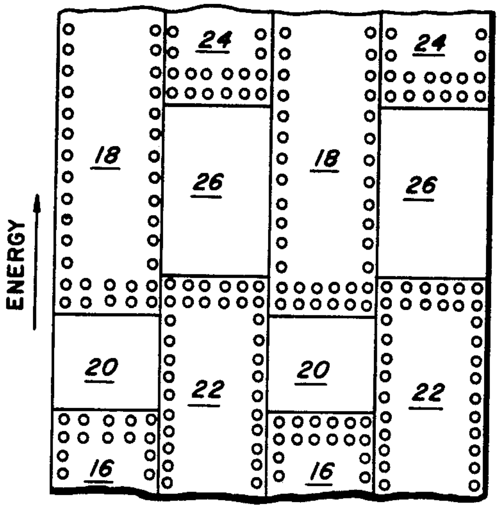
FIG. 1*b* is a representation of the electronic band structure of the superlattice of FIG. 1*a*.
Figure 1C:
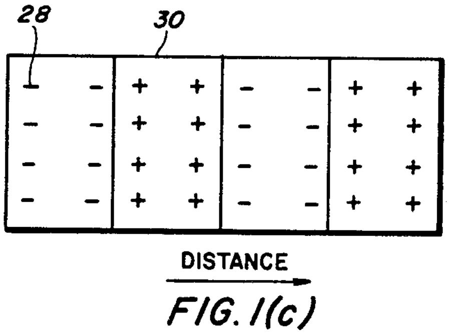
FIG. 1*c* is a representation of the distribution of space charge in the superlattice of FIG. 1*a*.

The two materials InAs 11 and GaSb 12 are both semiconductors, the electronic energy band structures of which are shown in FIG. 1b. InAs 11 has a valence band 16 and a conduction band 18 separated by a bandgap 20 in which there are no possible energy states. Similarly GaSb 12 has a valence band 22, a conduction band 24 and bandgap 26. In normal bulk semiconductors the valence bands 16 and 22 are filled, there are no available states in the bandgaps 20 and 26, and the available states in the conduction bands 18 and 24 are unoccupied because of the lack of additional charge carriers. When a superlattice of InAs-GaSb is brought together as shown in FIG. 1a, the bands of the materials come into equilibrium relative to each other as shown in FIG. 1b. The details of the bands of the superlattice are complex and are described in the articles "Semiconductor Superlattices in High Magnetic Fields" by L. Esaki and L. L. Chang, Journal of Magnetism and Magnetic Materials, Volume 11, page 208, 1979 and "InAs-GaSb Superlattice Energy Structure and its Semiconductor-semimetal Transition" by G. A. Sai-Halasz, L. Esaki and W. A. Harrison, Physical Review B, Volume 11, page 2812, 1978. The important point is that in equilibrium, electronic states are allowed at those energies where the InAs conduction band 18 overlaps the GaSb valence band 22 in InAs-GaSb superlattices with periods greater than 17 nm. For the effects to be seen it is required that the superlattice be well made, such as those grown by molecular beam epitaxy as described by Cho et al. in U.S. Pat. No. 3,929,527. When the normally filled GaSb valence band 22 is at higher energy than the normally empty InAs conduction band 18, electrons transfer from the GaSb 12 to the InAs 11 creating the space charge distribution as shown in FIG. 1c. It can be seen that excess negatively charged electrons 28 occupy the InAs layers 11 and positively charged holes 30 occupy the GaSb layers, i.e. there results an alternating space charge.

Figure 2:
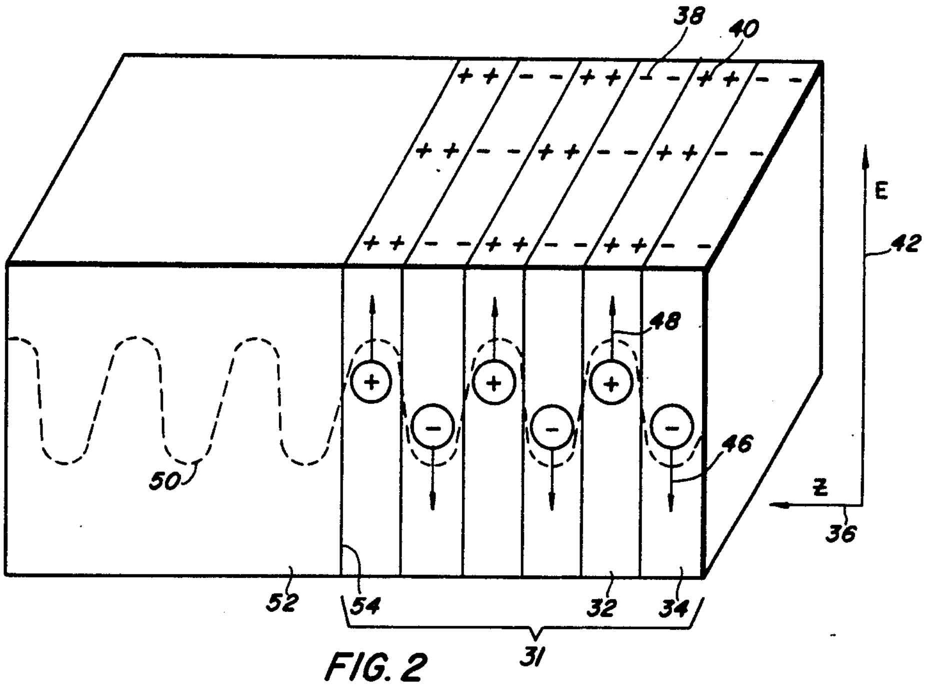
FIG. 2 is a perspective view of the generation of an acoustic wave by a transient electric field in a superlattice of the type of FIG. 1*a*.

The invention as shown in FIG. 2 requires a semiconducting superlattice composed of alternating layers 32 and 34 along a z-direction 36 with space charge varying along this same direction. Shown in FIG. 2 is a relatively uniform positive charge density 38 in one set of layers 32 and a corresponding negative charge density 40 in the other set of layers 34. The charge distribution within the layers 32 and 34 need not be uniform in the z-direction 36 for the superlattice 31 to be subject to the same type of effects.

If an electric field E 42 is externally applied to the space charge regions of the superlattice 31 in a direction 44 perpendicular to the z-direction 36, it will impart momentum to all charges. The electric field can result from electromagnetic radiation or by impressing a voltage between two plates. Because of the differing signs of the charges, the momentum 46 imparted to the positive charge 38 in layer 32 will be in the opposite direction from that 48 imparted to the negative charge 40 in layer 34. The momenta 46 and 48 on the charges 38 and 40 will be transferred by collisional drag to the crystal structure of the layers 32 and 34. The transferred momenta produce a structural distortion which is in different directions in the alternate layers 32 and 34. When the electric field 42 is reversed to the direction opposite to the first direction, the crystal distortion reverses. There results a distortion wave 50 along the z-direction 36 which constitutes a transverse acoustic wave or a wave of phonons. The wave 50 is not confined to the superlattice region or the alternating layers 32 and 34 but propagates into a substrate 52 that is properly matched with the superlattice and properly coupled at the substrate interface 54.

Any type of change in the electric field 42 will induce a corresponding acoustic wave 50. The field may be pulsed, reversed, varied sinusoidally or time varied in any manner so as to be transient rather than time invariant. However, the frequency of variation must satisfy $$\omega \cdot \tau << 1 \quad (1)$$

where $\omega$ is the angular frequency of the propagating acoustic wave and $\tau$ is the lifetime of the charge carriers.

Furthermore any spatial variation of the electric field along the wave propagation direction, i.e. along the z-direction 36, must be slow relative to the superlattice period d.

Figure 3:
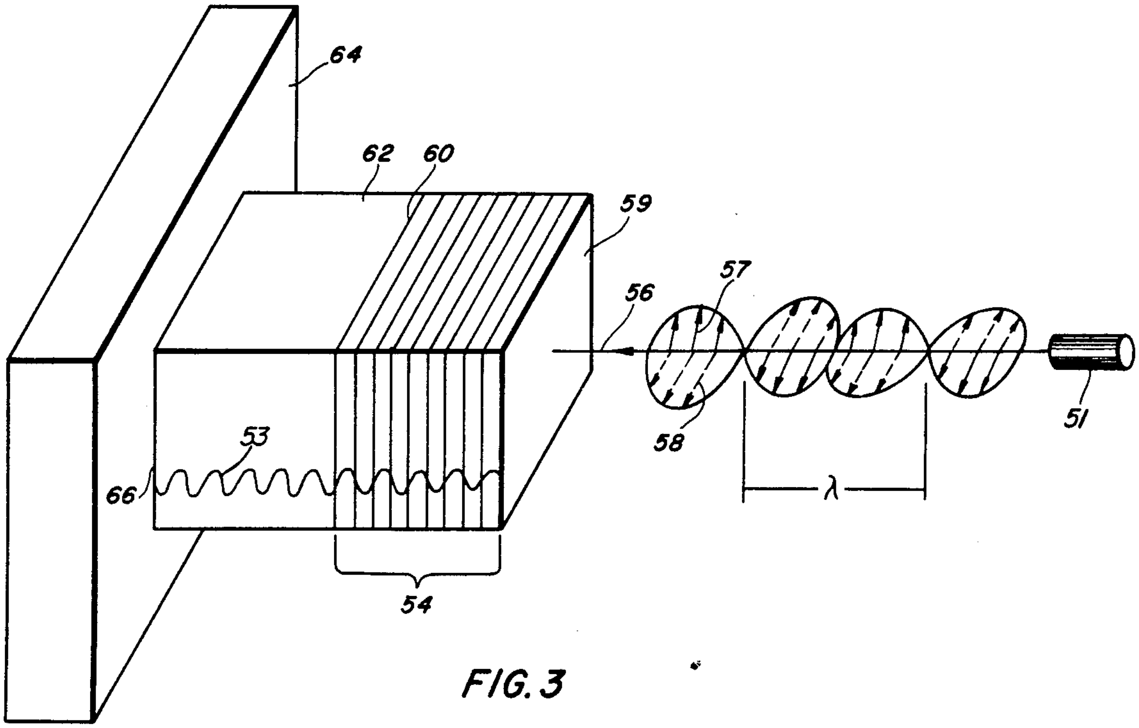
FIG. 3 is a perspective view of the preferred embodiment of an acoustic wave generator.

The preferred embodiment is shown in FIG. 3 wherein a far infrared laser 51 is aligned with the superlattice 54 substantially parallel to its axis of variation. The far infrared radiation wave 56 propagates toward the superlattice with an alternating electric field 57 and magnetic field 58 orthogonal to each other and to the axis of propagation. The far infrared radiation 56 is characterized by frequency $\omega_{IR}$ and wavelength $\lambda$. The radiation wave 56 penetrates the superlattice 54 wherein its wavelength is modified by the dielectric characteristics of the superlattice. It should be noted that the modified wavelength $\lambda'$ of the infrared radiation must be much greater than the superlattice period d.

The alternating electric will produce a force, $F_c$, on a unit volume of the superlattice at a frequency $\omega_{IR}$. The equation of motion of the displacement $\xi(r,t)$ of the lattice is given by $$\rho_l \ddot{\xi}(r,t) = -C_t \nabla x[\nabla x \xi(r,t)] + F_c \quad (2)$$

where $\rho_l$ is the specific density of the superlattice and $C_t$ is the proper elastic constant associated with shear distortion. The space and time Fourier transform $\xi(q,\omega)$ of the displacement vector. $\xi(r,t)$ will have a resonance for $$\omega = \omega_{IR} \quad (3)$$

and $$q = 2\pi N/d \quad (4)$$

where N is an integer. The acoustic wave 53 resulting from the displacement has its frequency and wavenumber related by $\omega = s_t q$ where $s_t$ is the velocity of a transverse acoustic wave in the superlattice.

The exact form of the acoustic wave 53 set up by the electromagnetic wave 56 depends on the boundary or loading conditions imposed upon the superlattice 54. If one end 59 of the superlattice 54 is left free of any further mechanical constraints and if the other end 60 is matched to a substrate 62 which in turn is matched to the acoustic system 64 which does not reflect waves back into the substrate 62, then the wave 53 generated in the superlattice 54 will propagate therefrom through the substrate 62 and be guided into the acoustic system 64. The acoustic system 64 is the system for which the acoustic waves are being generated such as an acoustic microscope or a acousto-optical processor or any system requiring high frequency acoustic waves. Reflections of the acoustic wave 53 at either the superlattice-substrate interface 60 or the substrate-system interface 66 can be prevented by impedance matching the various materials. This matching can be accomplished by using materials for the superlattice 54, substrate 62 and acoustic system 64 with similar elastic constants and by joining the parts with a rigid mechanical bond at the interfaces 60 and 66. For instance, the substrate can be grown by the same method of molecular beam epitaxy as the superlattice with a uniform composition that is a mixture of the compositions of the alternating layers of the superlattice 54.

The frequency $\omega$ of the acoustic wave 53 generated in the superlattice 56 and transported into the acoustic system is that of the electromagnetic wave 56. The acoustic wave is excited only when the resonance conditions of Equations (3) and (4) are satisfied, i.e. when the far infrared frequency is matched to the superlattice period d by the relation $$\omega = 2\pi s_t N/d \qquad (5)$$

If a non-sinusoidal waveform for electric field is used, such as a pulsed electric field supplied by capacitive plates, then that waveform's Fourier components will determine the multiple frequencies characterizing the forcing waveform.

The velocity of a transverse acoustic wave 53 is about $3\times10^5$ cm/s. A far infrared laser 51 of angular frequency $10^{11}$ to $10^{12}$/s will coherently excite the acoustic wave 53 characterized by phonons of wavenumber q between $3\times10^5$ and $3\times10^6$ cm$^{-1}$. These wavenumbers correspond to a superlattice period d of between 20 and 200 nm for the transducer operating in its most efficient mode, i.e. N=1. Superlattice periods of such values are compatible with the period required to create space charge in the InAs-GaSb superlattice of FIG. 1*a*. Since such an acoustic wave is of a frequency far higher than the audible range, it is also called an ultrasonic wave.

The foregoing description of the InAs-GaSb superlattice and transducer should not imply that only the combination of InAs and GaSb will produce an effective acoustic wave generator. Nor is the charge transfer mechanism characterized by the band structure of FIG. 1*b* the only one that can create a space charge differing in the two types of layers.

Figure 4A:
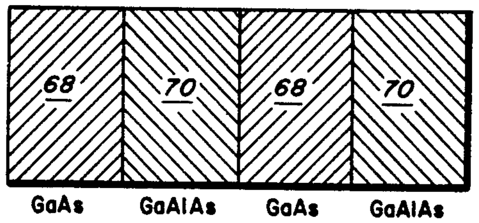
FIG. 4*a* is a cross-sectional representation of a superlattice of GaAs-GaAlAs.
Figure 4B:
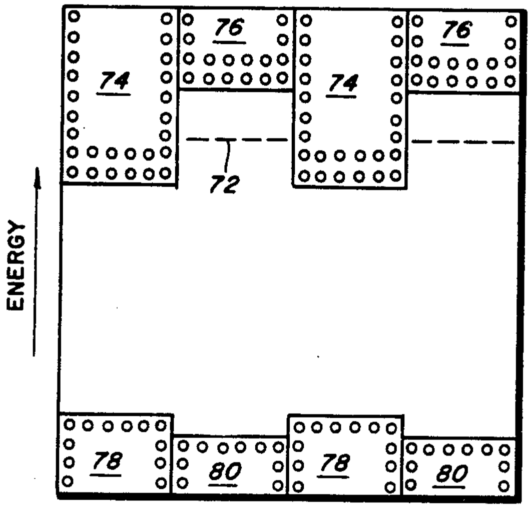
FIG. 4*b* is a representation of the electronic band structure of the superlattice of FIG. 4*a*.

Another pair of materials which when used as constituents of a superlattice can produce acoustic waves are GaAs and GaAlAs where GaAlAs is shorthand for $Ga_{1-x}Al_xAs$ where x can assume any of a range of values between 0.03 and 1.0. The band structure has been calculated for x=0.65 so that this value of x is the preferred one. In FIG. 4*a* is shown the superlattice of alternate layers of GaAs 68 and GaAlAs 70 repeating on a period d. The GaAlAs layers 70 are doped with donor atoms which create donor energy levels 72 near the top of the band gap, but which are spatially localized in the GaAlAs 70, i.e., the quantum mechanical electron wave function of the donors does not significantly extend into the GaAs 68. The lower edges of the conduction bands of the GaAs 74 and of the GaAlAs 76 differ significantly in energy while the valence bands of the GaAs 78 and GaAlAs 80 are relatively equal.

Figure 4C:
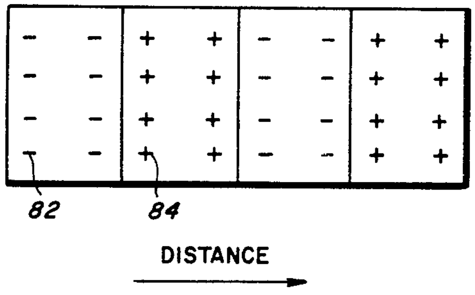
FIG. 4*c* is a representation of the distribution of space charge in the superlattice of FIG. 4*a*.

Because the donor levels 72 lie so close to the GaAlAs conduction band 76, they will be mostly ionized but the resulting free electrons, instead of staying in the GaAlAs conduction band 76, will transfer into the lower energy states of the GaAs conduction band 74. There results, as shown in FIG. 4*c*, a space charge distribution of excess negatively charged free electrons 82 in the GaAs 68 and uncompensated positively charged donors 84 in the GaAlAs 70. This space charge distribution can interact with a transient electric field in the same way as the space charge in a InAs-GaSb superlattice.

Figure 5A:
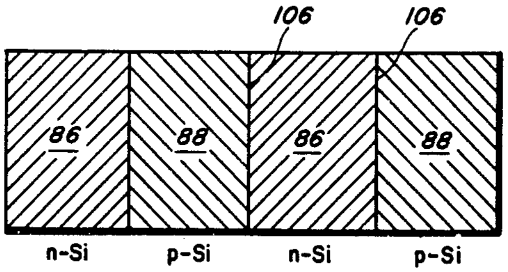
FIG. 5*a* is a cross-sectional representation of a modulation doped superlattice.

Yet another method of creating periodic space charge requires only a periodic variation in the dopant instead of a periodic change in the semiconductor composition. The method is often called modulation doping. In FIG. 5*a* is shown a semiconductor dopant superlattice composed of alternating layers of n-type silicon 86 created by doping that layer of silicon with a donor such as phosphorous and p-type silicon 88 created by doping that layer of silicon with an acceptor such as boron. The doping repeats on a superlattice period d.

Figure 5B:
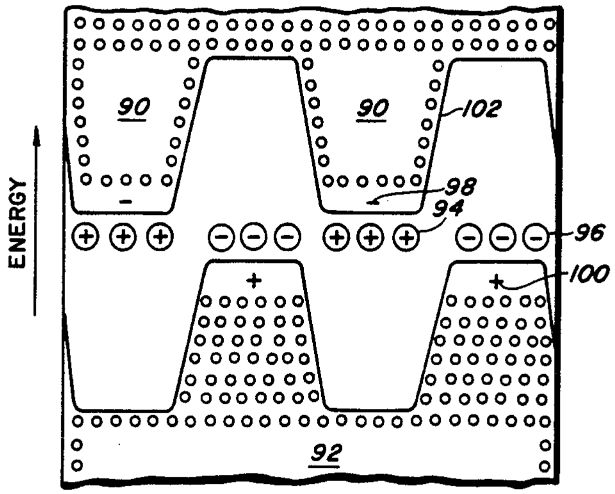
FIG. 5*b* is a representation of the electronic band structure of the superlattice of FIG. 5*a*.
Figure 5C:
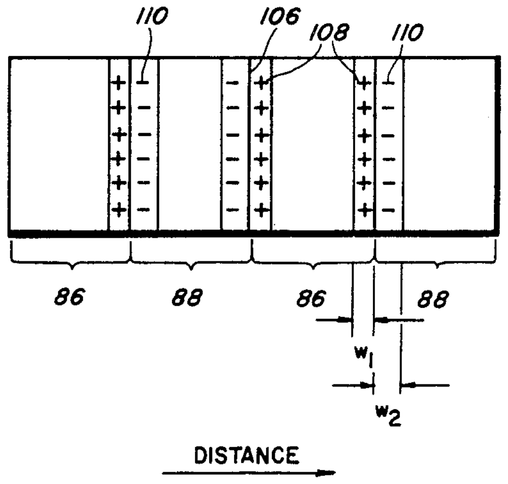
FIG. 5*c* is a representation of the distribution of space charge in the superlatice of FIG. 5*a*.

The resulting superlattice band structure is shown in FIG. 5*b* wherein the relative spatial positions of the conduction band 90 and the valence band 92 are controlled by the density and energy levels of the positively ionized donors 94 and negatively ionized acceptors 96. Under normal conditions in bulk material, most of the donors 94 would be ionized, with the associated free electrons 98 producing local charge neutrality. Likewise the holes 100 freed from the mostly ionized acceptors 96 would produce local charge neutrality. However the thermal equilibrium bending of the bands 102 and 104 is effected by the ionized dopants 94 and 96 near the interface 106 between the differently doped regions not neutralized by corresponding free charge. In equilibrium the p-n junction 106 shown in FIG. 5*c* between the p-region 88 and n-region 86 has positive space charge region 108 of width $w_1$ on the n-side 86 of the interface 106 occupied by unneutralized donors 94 and a negative space charge region 110 on the p-side 88 of the interface 106 of width $w_2$ occupied by unneutralized acceptors 130. The space charge is not necessarily spread throughout the superlattice layers 86 and 88. Instead the widths $w_1$ and $w_2$ of the layers 108 and 110 are controlled by the doping densities and to a lesser extent the species of dopant.

The space charge regions 108 and 110 can interact with a transient electric field in much the same way as the space charge regions in the InAs-GaSb superlattice.

The generator of this invention can be implemented as an opto-acoustic transducer which is a specialized type of acoustic wave generator. If the source of far-infrared radiation or other transient electric field is not always active but supplies the radiation to the herein described generator at intermittent intervals, then acoustic waves will be generated at those same intermittent intervals. Thus a signal impressed upon a far-infrared optical link can be transformed to an equivalent signal on an acoustic link by a transducer comprising the superlattice of this description. Such a transducer would be useful at the input to a phonon data processing system or as a coupler in a opto-phonon processor.

Obviously, numerous modifications and variations of the present invention are possible in light of the above teachings. It is therefore to be understood that within the scope of the appended claims, the invention may be practiced otherwise than as specifically described herein.

What is claimed and desired to be secured by Letters Patent of the United States is:

1. An ultrasonic wave generator for generating ultrasonic waves to be guided into an acoustic system comprising:

a body of material with at least a portion thereof extending in one direction that includes a semiconductor superlattice structure, said superlattice structure having a periodic variation in the electronic character of the semiconductor material along the length thereof in said one direction for a plurality of spatial periods, thereby resulting in a periodic variation in the net space charge density in said superlattice;

means for generating a coherent far-infrared beam which is directed along said one direction, such that a transient electric field perpendicular to said one direction is applied to said superlattice portion;

means for guiding the ultrasonic wave away from said superlattice structure, and for guiding the ultrasonic wave into the acoustic system.

2. An ultrasonic wave generator as recited in claim 1, wherein said means for generating the far-infrared beam is a laser.

3. An ultrasonic wave generator as recited in claim 1 wherein said superlattice structure comprises a semiconductor material of essentially constant crystalline composition and with its doping concentrations in the semiconductor material varying with the period of the superlattice.

4. An ultrasonic wave generator as recited in claim 1, wherein said superlattice structure comprises alternating layers of GaAs and GaAlAs.

5. An ultrasonic wave generator as recited in claim 4 wherein the atomic ratio of Ga to Al in the GaAlAs is substantially 35 parts Ga to 65 parts Al.

6. An ultrasonic wave generator as recited in claim 1 wherein said superlattice structure comprises alternating layers of InAs and GaSb.

7. An ultrasonic wave generator as recited in claim 1 or 2 wherein the superlattice spacing is between 10 and 100 nm.

8. An ultrasonic wave generator as recited in claim 7 wherein said superlattice structure comprises a semiconductor material of essentially constant crystalline composition and with its doping concentrations in the semiconductor material varying with the period of the superlattice.

9. An ultrasonic wave generator as recited in claim 7, wherein said superlattice structure comprises alternating layers of GaAs and GaAlAs.

10. An ultrasonic wave generator as recited in claim 7 wherein the superlattice structure comprises alternating layers of InAs and GaSb.

11. An ultrasonic wave generator as recited in claim 7 wherein the superlattice period is between 20 and 200 nm.

12. An ultrasonic wave generator for generating ultrasonic waves to be guided into an acoustic system, comprising:

a body of material with at least a portion thereof extending in one direction that includes a superlattice structure of period between 20 and 200 nm comprising a plurality of alternating layers of InAs and GaSb;

a far-infrared laser the beam of which is directed along said one direction; and means for guiding the ultrasonic wave away from said superlattice structure, and for guiding the ultrasonic wave into the acoustic system.

13. A method for generating ultrasonic waves to be guided into an acoustic system, comprising:

generating coherent infrared radiation; and directing said radiation into a body of material at least a portion of which extends in the direction of said beam in the form of a superlattice structure, which superlattice structure has a periodic variation in the electronic character of the material along the length thereof in the direction of the beam for a plurality of spatial periods;

and guiding the ultrasonic waves generated by the superlattice structure away from the superlattice structure and into the acoustic system.

* * * * *